(12) United States Patent
Zhang

(10) Patent No.: US 12,411,181 B2
(45) Date of Patent: Sep. 9, 2025

(54) HYBRID SERIAL BATTERY TESTING SYSTEM

(71) Applicant: Chaojiong Zhang, College Station, TX (US)

(72) Inventor: Chaojiong Zhang, College Station, TX (US)

( * ) Notice: Subject to any disclaimer, the term of this patent is extended or adjusted under 35 U.S.C. 154(b) by 0 days.

(21) Appl. No.: 18/286,421

(22) PCT Filed: Sep. 21, 2022

(86) PCT No.: PCT/US2022/044178
§ 371 (c)(1),
(2) Date: Oct. 11, 2023

(87) PCT Pub. No.: WO2023/055618
PCT Pub. Date: Apr. 6, 2023

(65) Prior Publication Data
US 2024/0280642 A1     Aug. 22, 2024

Related U.S. Application Data

(60) Provisional application No. 63/251,104, filed on Oct. 1, 2021.

(51) Int. Cl.
| | |
|---|---|
| G01R 31/3842 | (2019.01) |
| G01R 31/367 | (2019.01) |
| H01M 10/48 | (2006.01) |

(52) U.S. Cl.
CPC ....... *G01R 31/3842* (2019.01); *G01R 31/367* (2019.01); *H01M 10/482* (2013.01)

(58) Field of Classification Search
None
See application file for complete search history.

(56) References Cited

U.S. PATENT DOCUMENTS

2022/0074998 A1 *   3/2022   Aquilano ............. G01R 31/392

* cited by examiner

*Primary Examiner* — Jas A Sanghera
(74) *Attorney, Agent, or Firm* — Stephen S. Hodgson

(57) ABSTRACT

A high voltage high current (HVHC) battery testing system (BTS) is provided that has a plurality of HVHC channels for testing multiple batteries simultaneously, where each HVHC channel provides programmed current, voltage or power, and where each HVHC channel is configured to test multiple batteries connected in a series configuration simultaneously. A low voltage low current (LVLC) BTS has a plurality of LVLC channels, where an LVLC channel is connected to each of the batteries or to each group of the batteries in a parallel configuration. Each LVLC channel provides programmed current, voltage or power according to a preloaded schedule or to a command from a control unit. The LVLCBTS is configured to provide measurement, storage and transfer of test data according to a programmed schedule. The HVHCBTS and the LVLCBTS are configured to pass current through each battery simultaneously, where the current passed through each battery by the LVLCBTS is less than 10% of the current passed through each battery by the HVHCBTS.

26 Claims, 1 Drawing Sheet

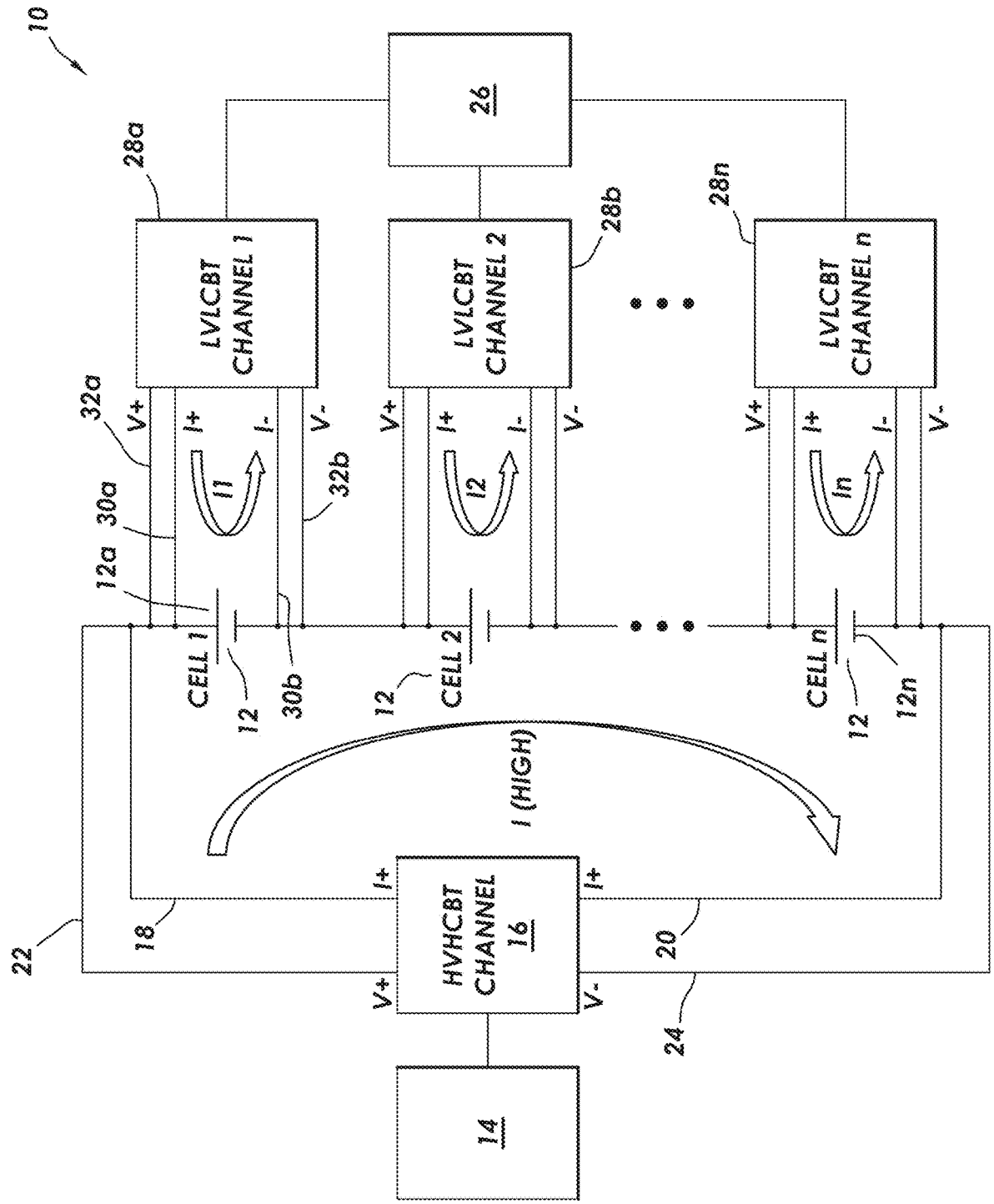

HYBRID SERIAL BATTERY TESTING SYSTEM

CROSS-REFERENCE TO RELATED APPLICATIONS

This is a national-stage application of International Application No. PCT/US2022/044178 filed on 21 Sep. 2022, which was published as International Pub. No. WO 2023/055618 A1, which claims priority to U.S. Provisional Patent Application Ser. No. 63/251,104 filed on 1 Oct. 2021. This application is related to the present inventor's International Patent Application No. PCT/US2020/062548, Publication No. WO 2021/113161 A2, which is incorporated by reference in its entirety for all purposes.

BACKGROUND OF THE INVENTION

1. Field of the Invention

This patent application pertains to battery formation and testing, particularly to forming and testing batteries in both a parallel and a series configuration, and more particularly to testing batteries and groups of parallel batteries arranged in a series configuration.

2. Description of the Related Art

The present inventor's International Patent Application No. PCT/US2020/062548, Publication No. WO 2021/113161 A2, ("the '161 application") provides a circuit assembly for forming and testing batteries that includes a battery testing system (BTS) having channels for testing multiple batteries simultaneously; a parallel test management device (PTMD) for each battery, where each PTMD connects to its respective battery serially to form a PTMD-battery combination. The PTMD includes a main relay or switch for connecting to a battery; a current transducer or shunt connected in series with the main relay; and an auxiliary relay connected in series with a current limiting resistor, where the auxiliary relay and the current limiting resistor are parallel to the main relay. Circuits connect PTMD-battery combinations in parallel to form parallel PTMD-battery groups and connect the parallel PTMD-battery groups to a BTS channel, which provides programmed current, voltage or power to the batteries. The current is distributed to each battery in a balanced manner.

The '161 application provides a method for forming and testing a plurality of batteries connected in parallel and in series, which includes connecting a PTMD to each battery to form a PTMD-battery combination; connecting the PTMD-battery combinations in parallel to form a parallel battery group; connecting a plurality of parallel battery groups in series to form a parallel-serial battery group; connecting a voltage equalizer to each parallel battery group; connecting an equalizer power supply to the voltage equalizers; connecting a regulator to the parallel-serial battery group; and forming and/or testing the batteries by running current from the regulator and from the equalizer through the plurality of batteries simultaneously. Battery capacity and coulombic efficiency are measured using both CCCV charge and CCCV discharge. The current through batteries is preferably about zero at the end of charge and discharge, and the voltage drop across the circuit resistance, such as copper trace, relay and current transducer, is preferably about zero at the end of charge and discharge.

A parallel serial test management device or PSTMD for forming and testing a plurality of batteries connected in parallel and in series is also described in the '161 application. The PSTMD includes a PTMD for connecting to a battery to form a PTMD-battery combination; and a parallel PTMD-battery group formed by connecting the PTMD-battery combinations in parallel. A series of parallel battery groups formed by connecting two or more parallel battery groups in series forms a parallel-serial battery group; a voltage equalizer connected to each parallel battery group; an equalizer power supply connected to the voltage equalizers; and a regulator connected to the parallel-serial battery group. Battery testing and formation are performed by running current from the regulator and from the equalizer through the plurality of batteries simultaneously.

A serial-parallel testing module (SPTM) for forming and testing a plurality of batteries is also described in the '161 application. The SPTM includes a circuit board for receiving and connecting to a plurality of batteries and for receiving electrical components and for providing circuits among the electrical components and between the electrical components and the batteries, and a PTMD for each battery, where each PTMD connects to its respective battery serially to form a PTMD-battery combination. Circuits are included for connecting PTMD-battery combinations in parallel to form parallel PTMD-battery groups and for connecting the parallel PTMD-battery groups to a BTS channel or to a regulator, where the BTS channel or the regulator provides programmed current, voltage or power, and where current is distributed to each battery in a balanced manner. A voltage equalizer is connected to the parallel PTMD-battery groups, and an equalizer power supply is connected to the voltage equalizer. The BTS or the regulator and the voltage equalizer power supply are connected to power supply ports. A power supply for the BTS can have a plurality of channels, where each channel is designed and sized to provide an output of over 20 volts, of over 25 amps and of over 500 watts, or of over 100 volts, of over 1000 amps and of over 100,000 watts. The batteries are formed and tested by running current from the BTS or the regulator and from the equalizer through the plurality of batteries simultaneously.

The '161 application describes a smart battery tray for holding a plurality of batteries during formation and testing of the batteries, which comprises: a printed circuit board (PCB) having opposing upper and lower sides and an edge; a plurality of battery holders on the upper side of the PCB; electronic devices or components operatively engaged with the plurality of battery holders through traces on or in the PCB for measuring parameters of the batteries during formation and testing; and an edge connector on the edge of the PCB, where the edge connector is operatively engaged with the plurality of battery holders and with the electronic devices or components through traces on or in the PCB. Each battery holder has two or more upright spring fingers for holding and engaging a battery, which also function as a negative terminal, and a positive terminal for contact with one end of a battery. The edge connector has first and second opposing sides, with each positive terminal connected to the first side, and each negative terminal is connected to the second side. Batteries are received in the battery holders in an upright position with the lower end of the battery touching the positive terminal and with the spring fingers touching the cylindrical case of the battery, which is the negative terminal.

The battery formation and testing system of the '161 application includes a serial-parallel testing module (SPTM) for providing control, measurement and safety monitoring for the batteries as the batteries are formed and tested, where the SPTM comprises a printed circuit board, an edge connector on the board for plugging into an edge-connector socket, electronic devices and components on the board that provide control and measurement functions; and a plurality of battery connectors connected to the board. The SPTM is designed to accommodate a plurality of batteries that are connected together in series and in parallel for forming and testing the batteries.

Demands on batteries continue to increase. There is an ongoing need to make and test batteries with greater and greater precision, preferably at a lower cost.

SUMMARY OF THE INVENTION

The present invention provides a circuit assembly for testing a plurality of batteries that comprises: a high voltage high current (HVHC) battery testing system (BTS) having a plurality of HVHC channels for testing multiple batteries simultaneously, where each HVHC channel provides programmed current, voltage or power, and where each HVHC channel is configured to test multiple batteries connected in a series configuration simultaneously; and a low voltage low current (LVLC) BTS having a plurality of LVLC channels, where an LVLC channel is connected to each battery or to each group of batteries in a parallel configuration but not to more than one battery or to more than one group of batteries in a parallel configuration, where each LVLC channel provides programmed current, voltage or power according to a preloaded schedule or to a command from a control unit, where the LVLCBTS is configured to provide measurement, storage and transfer of test data according to a programmed schedule or to an instruction from the control unit, where the HVHCBTS and the LVLCBTS are configured to pass current through each battery simultaneously, and where the current passed through each battery by the LVLCBTS is less than 10%, preferably less than 7%, of the current passed through each battery by the HVHCBTS. Each LVLC channel is preferably configured to operate as an independent battery testing channel.

The circuit assembly for testing the plurality of batteries can also be used to form batteries with the following additions to the circuit assembly; a parallel test management device (PTMD) for each battery, where each PTMD connects to its respective battery serially to form a PTMD-battery combination, where the PTMD comprises a main relay or switch for connecting to a battery, a current transducer or shunt connected in series with the main relay; and an auxiliary relay connected in series with a current limiting resistor, where the auxiliary relay and the current limiting resistor are parallel to the main relay; and circuits for connecting PTMD-battery combinations in parallel to form parallel PTMD-battery groups and for connecting the parallel PTMD-battery groups to an HVHC channel, where current is distributed to each battery in a balanced manner, and where one HVHC channel can form or test multiple batteries simultaneously.

BRIEF DESCRIPTION OF THE DRAWING

The FIGURE is a diagram of a hybrid serial battery testing system, according to the present invention.

TERMINOLOGY USED HEREIN

A C-rate is a measure of the rate at which a battery is charged or discharged relative to its maximum capacity. A 1C rate means that the discharge current will fully discharge the fully charged battery in 1 hour, and 2C rate means that the discharge current will fully discharge the fully charged battery in ½ hour. For example, when the capacity of a battery is 2 Ah (AmpHour), 1C rate current is 2 Amp, and 0.05 C rate is equal to 0.1 Amp.

CCCV represents a procedure that starts with constant current control and when the battery voltage reaches to a set voltage, transfer to constant voltage control and keep the voltage at the set voltage. CC stands for Constant Current and CV stands for Constant Voltage.

Battery: the meaning of battery here includes single cell and battery pack. A battery pack may have only 2 current terminals outside but may have a complicated structure inside such as multiple cells in parallel and serial arrangement and a battery management system.

Battery formation is a process for performing an initial charge/discharge operation onto a raw battery cell. A cell's capacity and internal resistance is typically measured. A cell-sorting process is typically used to sort cells according to a cell's capacity and internal resistance.

State of Charge or SOC is a level of charge of an electric battery relative to its maximum capacity. SOC is expressed as a percentage of maximum capacity.

A Parallel Test Management Device or PTMD refers to a device that connects to a battery or to a group of batteries that are arranged in parallel, where the batteries in the group connect to each other in parallel through the PTMD. Functions of a PTMD include current measurement, voltage pre-equalizing, current switching and other functions.

A Serial Test Management Device or STMD equalizes voltage and measures current for each single battery in a serial connection. An STMD does not have a current switch.

A Parallel Serial Test Management Device or PSTMD is a combination of PTMD and STMD, which is used to manage batteries in parallel and serial arrangement.

A voltage equalizer is typically used in a battery pack to equalize the voltage across all of the batteries in the battery pack. The voltage equalizer gets energy from the battery pack or from adjacent batteries. The '161 application discloses a voltage equalizer used in battery formation and testing that takes energy from a dedicated equalization power supply and provides equalization at a much higher level of accuracy than a voltage equalizer for a battery pack.

A Battery Management System or BMS is a device to manage a battery pack, such as equalizing cells, checking battery health status, checking state of charge, safety protection and communications. According to complexity level, most battery pack have some kind of BMS.

A Battery Testing System or BTS refers to a category of electrical equipment, which apply different forms of charge/discharge current/voltage to a battery or batteries to study or characterize the battery or batteries, including formation of the battery or batteries. A commercial BTS is usually composed of one or multiple channels. Each BTS channel can perform the above functions independently and completely. A BTS channel is specified by output capability, including current, voltage and power.

DETAILED DESCRIPTION OF THE EXEMPLARY EMBODIMENTS

The present invention provides a system and method for testing multiple batteries in a series configuration. Groups of batteries may be arranged in a parallel configuration to form a parallel group, and multiple parallel groups can be connected in series. Batteries have been formed and tested in the past using the principle of accurate current control for every battery. Due to the electrochemical nature of a battery, its voltage is a significant parameter for indicating the health, capability and status of a battery. A voltage-control process with current self-balancing or adjustment is considered more suitable for the natural characteristics of a battery than current control.

When batteries with each having a different SOC/voltage are connected in parallel, a battery with a higher voltage will charge other batteries until the current flow between batteries reaches zero, which results in all of the batteries having the same SOC. Paralleling batteries will force batteries to have the same voltage. When applying current to batteries that are connected in parallel and have the same specifications, the current flow through each battery will be evenly distributed, provided the batteries have the same health status and the same real capacity, or the current will be distributed according to real capacity and health status automatically. The battery formation and testing scheme described in the '161 application does not force current distribution between batteries and does not control current flow through a battery at a predefined value while the batteries are in a parallel configuration for testing. When the batteries have the same specifications and health status, the current through each battery will be roughly the same with a slight difference determined by differences in capacity and health status. The current through each battery will be proportional to a battery's real capacity. All batteries in a parallel group are forced to have the same voltage by the nature of paralleling, and one can say that the batteries are actually under voltage control instead of under current control. In a battery pack or in a simple battery formation system, there will generally be some current flow between batteries in parallel mode. Healthier batteries will charge weaker batteries with higher leakage current to keep the same voltage.

When batteries are connected in series, in CC mode, a BTS channel applies current defined by CC (or CC*N when N batteries are connected in parallel). In CV mode, a BTS channel also applies current to enable an equalizer to fine tune each battery (or each parallel group of batteries) to reach a defined voltage value. The current through each battery cell is the sum of current from the BTS channel plus current from the equalizer. In serial testing, all batteries are controlled to have the same voltage, but the current through each battery will most likely be slightly different. Batteries will be unlikely to have exactly the same current while tested when connected in series.

The FIGURE is a diagram of a hybrid serial battery testing system 10, according to the present invention. A plurality of batteries 12 are arranged in a series configuration. Each of the batteries 12 can represent a group of batteries arranged in a parallel configuration. A high voltage high current (HVHC) battery testing system (BTS) 14 has a plurality of HVHC channels. One of the plurality of HVHC channels of the HVHCBTS 14, an HVHC channel 16, is connected across the plurality of batteries 12. A conductor 18 provides a pathway for current to flow from HVHC channel 16 to a first battery 12a in the series of batteries 12. A conductor 20 provides a pathway for current to flow from a last battery 12n in the series of batteries 12 to the HVHC channel 16. Any number of batteries can be between the first battery 12a and the last battery 12n. A conductor 22 provides a pathway between HVHC channel 16 and the first battery 12a in the series of batteries 12 for measuring voltage. A conductor 24 provides a pathway between the last battery 12n in the series of batteries 12 to the HVHC channel 16, and conductor 22 provides a pathway between the first battery 12a in the series of batteries 12 to the HVHC channel 16 for measuring voltage across the batteries 12.

A low voltage low current (LVLC) BTS 26 has a plurality of LVLC channels 28a to 28n, where 28n implies any number of LVLC channels. LVLC channel 28a is connected across the first battery 12a. Conductors 30a and 30b provide pathways for passing current from LVLC channel 28a through the first battery 12a. Conductors 32a and 32b provide pathways so that the LVLC channel 28a can measure the voltage across the first battery 12a. A LVLC channel 28b is connected to a second battery in the same manner. An LVLC channel 28n is connected to the last battery 12n in the same manner with a set of conductors for passing current through battery 12n and a set of conductors for measuring the voltage across battery 12n. All of the LVLC channels 28 preferably have the same specifications and operate in the same manner.

In the hybrid serial battery testing system 10, one HVHC channel connects to any number of batteries 12 that are arranged in a series configuration. Further, each of the batteries 12 can represent a group of batteries arranged in a parallel configuration. The HVHCBTS 14 and its plurality of channels, including HVHC channel 16, are preferably configured to provide sufficiently high levels of voltage and current to perform tests on the batteries to provide measurements of one or more of parameters, including, but not limited to, internal resistance, impedance, conductance, capacity, voltage, self-discharge, ability to accept a charge and state of health of the batteries 12.

One LVLC channel is connected to one of the batteries 12 in a one-to-one manner in the hybrid serial battery testing system 10. While HVHC channel 16 is running, each LVLCBT channel 28 acts primarily as a parallel channel, which provides programmed current, voltage or power according to a preloaded schedule or to a command from a control unit, and which provides measurement, storage and transfer of test data according to a programmed schedule or to an instruction from the control unit. While HVHC channel 16 is not running and is shut off or closed, each of the LVLC channels 28 is designed and configured to operate as a fully independent battery test channel. Hybrid serial battery testing system (HSBTS) 10 can share a large current source for several independent low current channels. The present inventor believes that HSBTS 10 provides better performance in control and measurement of battery capacity and coulombic efficiency (CE) than battery testing systems of the prior art, particularly for measuring battery capacity and CE of a group of batteries because batteries connected in series get exactly the same current from a HVHC channel. The LVLC channels 28 provide low voltage and low current relative to the HVHC channel 16, which is useful for measuring battery parameters, and which is not practical in a prior art battery testing system because it would be very expensive to add an additional low current range to a regenerative low voltage high current testing system.

The LVLC channels 28 provide parallel current with the current from the HVHC channel 16 to each of the batteries 12. The current passing through a battery 12 is the sum of current from LVLC channel 28 and HVHC channel 16. Typically, the maximum current of the LVLC channel 28 is about 0% to 6%, preferably 0% to 5%, of the maximum current provided by the HVHC channel 16. In some embodiments, the current passed through each battery by the LVLCBTS is at least about 0.5% of the current passed through each battery by the HVHCBTS. The current passed through each battery by the LVLCBTS 26 is generally less than 10% of the current passed through each battery by the HVHCBTS 14. This ratio is determined by the uniformity among the batteries 12.

A regenerative circuit is typically used for testing batteries using a high voltage, high current battery testing system for higher energy efficiency. Since the per watt cost of a regenerative HVHCBTS is much lower at higher voltage, it is believed that HSBTS 10 provides a cost saving for low voltage high capacity battery testing. Typically, a regenerative HVHCBTS provides better energy efficiency at higher voltage, especially for high current application. HSBTS 10 using a regenerative HVHCBTS is believed to offer a cost saving compared to a low voltage high capacity battery testing system for a same number of batteries tested. LVLCBTS 26 preferably uses a non-regenerative circuit for better performance since LVLCBTS 26 uses typically only about 1% to 5% of the energy consumed by the HVHCBTS 14 and therefore is not very expensive to operate.

HSBTS 10 is designed and configured to perform voltage equalization. LVLCBTS 26 is a fully functional battery testing system, which can provide a high-level equalization function with accuracy and speed. The batteries tested using HSBTS 10 are preferably of the same type and preferably have a very similar capacity. HVHCBTS 14 and its HVHC channel 16 provide high voltage high current full battery testing functions for the batteries, and if necessary, shut off or cut off a high current loop for protecting the batteries. HVHCBTS 14 may be designed and configured so that each channel can provide an output of over 20 volts, of over 25 amps and of over 500 watts, or of over 100 volts, of over 1000 amps and of over 100,000 watts.

Each of the LVLC channels 28 preferably has the same specifications as all of the other LVLC channels 28. One LVLC channel 28 is provided for each battery tested in HSBTS 10, and the LVLC channels 28 connect to one battery each. LVLCBTS 26 and its LVLC channels 28: provide low current ranges with much lower current, lower noise and higher resolution than HVHCBTS 14 and its HVHC channel 16; provide equalization current to the batteries to keep the batteries at the same voltage while HVHCBTS 14 is providing charge and discharge current, voltage to the series of batteries and while HVHCBTS 14 is turned off; carry out independent low voltage low current battery testing on each battery at much higher precision than HVHCBTS 14 while HVHCBTS 14 is turned off; carry out independent low voltage low current battery testing on each battery at much higher precision than HVHCBTS 14 while HVHCBTS 14 is providing a background current; and measure and compare differential current and capacity of each battery to get much higher precision measurements of each battery's current, capacity and coulombic efficiency CE. LVLCBTS 26 and its LVLC channels 28 may be designed and configured so that each of the plurality of LVLC channels 28 can provide multiple current ranges, which facilitates the testing and formation much more precisely. Each of the plurality of LVLC channels is configured to perform voltage equalization or testing for its respective battery or group of batteries in a parallel configuration by using a current corresponding to one of the multiple current ranges.

HVHCBTS 14 and LVLCBTS 26 and their respective channels are independent, full-scale battery testing channels. Each of HVHCBTS 14 and LVLCBTS 26 and their respective channels are designed and configured to: download and store test schedules, system configurations, and to execute the test schedules accordingly; conduct constant current (CC) and to conduct constant current to constant voltage (CCCV) charge and discharge; protect against overcharge, over discharge, over temperature and other malfunctions; to measure, store and transfer test data to a control unit or to a supervisory control system; and to communicate with a personal computer, a supervisory control system or other control/measurement units to perform battery testing and/or battery formation.

Embodiments of the Invention

1. A circuit assembly for testing a plurality of batteries comprising:
   a high voltage high current (HVHC) battery testing system (BTS) having a plurality of HVHC channels for testing multiple batteries simultaneously,
   wherein each HVHC channel provides programmed current, voltage or power, and
   wherein each HVHC channel is configured to test multiple batteries connected in a series configuration simultaneously; and
   a low voltage low current (LVLC) BTS having a plurality of LVLC channels,
   wherein an LVLC channel is connected to each battery or to each group of batteries in a parallel configuration but not to more than one battery or to more than one group of batteries in a parallel configuration,
   wherein each LVLC channel provides programmed current, voltage or power according to a preloaded schedule or to a command from a control unit,
   wherein the LVLCBTS is configured to provide measurement, storage and transfer of test data according to a programmed schedule or to an instruction from the control unit,
   wherein the HVHCBTS and the LVLCBTS are configured to pass current through each battery simultaneously, and
   wherein the current passed through each battery by the LVLCBTS is less than 10% of the current passed through each battery by the HVHCBTS.
2. The circuit assembly of embodiment 1, wherein each LVLC channel is configured to operate as an independent battery testing channel for a first battery or for a first group of batteries in a parallel configuration while no current from an HVHC channel flows through the first battery or through the first group of batteries in a parallel configuration.
3. The circuit assembly of embodiment 2, wherein a plurality of the LVLC channels are configured to share a common source of current.
4. The circuit assembly of embodiment 1, wherein an amount of current flowing through a second battery or through a second group of batteries in a parallel configuration while current from an HVHC channel and from a LVLC channel flows through the second battery or through the second group of batteries in a parallel configuration is the sum of the current from said HVHC channel and from said LVLC channel.
5. The circuit assembly of embodiment 1, wherein the current passed through each battery by the LVLCBTS is less than 6% of the current passed through each battery by the HVHCBTS.
6. The circuit assembly of embodiment 1, wherein the current passed through each battery by the LVLCBTS is approximately 0% to 5% of the current passed through each battery by the HVHCBTS.
7. The circuit assembly of embodiment 1, further comprising equipment and circuits for discharging the plurality of batteries, thereby providing a discharge current, and for passing the discharge current to an external electrical grid system.

8. The circuit assembly of embodiment 1, wherein each of the plurality of LVLC channels is configured with multiple current ranges.

9. The circuit assembly of embodiment 8, wherein each of the plurality of LVLC channels is configured to perform voltage equalization for its respective battery or group of batteries in a parallel configuration by using a current corresponding to one of the multiple current ranges.

10. The circuit assembly of embodiment 8, wherein each of the plurality of LVLC channels is configured to perform tests for its respective battery or group of batteries in a parallel configuration by using a current corresponding to one of the multiple current ranges, wherein the tests are related to measuring one or more parameters comprising internal resistance, impedance, conductance, capacity, voltage, self-discharge, ability to accept a charge/discharge and state of health.

11. The circuit assembly of embodiment 1, wherein the batteries in the plurality of batteries are of the same type and have the same capacity within about plus or minus 6%.

12. The circuit assembly of embodiment 1, wherein the plurality of HVHC channels are configured to provide sufficiently high levels of voltage and current to perform tests on the batteries to provide measurements of one or more of parameters, and wherein the parameters include internal resistance, impedance, conductance, capacity, voltage, self-discharge, ability to accept a charge/discharge and state of health.

13. The circuit assembly of embodiment 1, wherein the plurality of HVHC channels are configured to cut off or shut off a high-current loop to protect one or more batteries.

14. The circuit assembly of embodiment 1, wherein the plurality of LVLC channels are configured to have approximately the same specifications.

15. The circuit assembly of embodiment 1, wherein the LVLC channels are configured to provide lower current, lower noise and higher resolution than the HVHC channels for testing the batteries.

16. The circuit assembly of embodiment 1, wherein the LVLC channels are configured to provide an equalization current to their respective batteries to keep said batteries at about the same voltage while the HVHC channels provide charge and discharge current and voltage to said batteries and while the HVHC channels are turned off and not providing current through said batteries.

17. The circuit assembly of embodiment 1, wherein the LVLC channels are configured to provide independent low-voltage and low-current battery testing on each battery at a higher level of precision than provided by the HVHC channels while the HVHC channels are shut down or turned off.

18. The circuit assembly of embodiment 1, wherein the LVLC channels are configured to provide independent low-voltage and low-current battery testing on each battery at a higher level of precision than provided by the HVHC channels while the HVHC channels are providing a background current through the batteries.

19. The circuit assembly of embodiment 1, wherein the LVLC channels are configured to measure and compare differential current and capacity of each battery to obtain a higher level of precision than provided by the HVHC channels for measuring a battery's current, capacity and coulomb efficiency.

20. The circuit assembly of embodiment 1, wherein the HVHC channels and the LVLC channels are configured to provide independent, full-scale battery testing systems that are configured to download and store a test schedule and a system configuration and to execute the test schedule.

21. The circuit assembly of embodiment 1, wherein the HVHC channels and the LVLC channels are configured to conduct constant current (CC) charge and discharge for the batteries.

22. The circuit assembly of embodiment 1, wherein the HVHC channels and the LVLC channels are configured to conduct constant current to constant voltage (cccv) charge and discharge of the batteries.

23. The circuit assembly of embodiment 1, wherein the HVHC channels and the LVLC channels are configured to provide protection against overcharge, over discharge and over temperature of the batteries.

24. The circuit assembly of embodiment 1, wherein the HVHC channels and the LVLC channels are configured to measure, store and transfer test data.

25. The circuit assembly of embodiment 1, wherein the HVHC channels and the LVLC channels are configured to receive and to respond to instructions from a control unit.

26. The circuit assembly of embodiment 1, wherein the plurality of LVLC channels are configured to provide low levels of voltage and current to perform tests on the batteries to provide measurements of one or more of parameters, and wherein the parameters include internal resistance, impedance, conductance, capacity, voltage, self-discharge, state of health and ability to accept a charge/discharge.

27. A circuit assembly for forming and testing batteries comprising:
a circuit assembly for testing a plurality of batteries according to any one of embodiments 1 to 26;
a parallel test management device (PTMD) for each battery, wherein each PTMD connects to its respective battery serially to form a PTMD-battery combination, the PTMD comprising:
a main relay or switch for connecting to a battery;
a current transducer or shunt connected in series with the main relay; and
an auxiliary relay connected in series with a current limiting resistor, wherein the auxiliary relay and the current limiting resistor are parallel to the main relay; and
circuits for connecting PTMD-battery combinations in parallel to form parallel PTMD-battery groups and for connecting the parallel PTMD-battery groups to an HVHC channel.
wherein current is distributed to each battery in a balanced manner, and
wherein one HVHC channel can form or test multiple batteries simultaneously.

28. The circuit assembly of embodiment 27, wherein the LVLC channels are configured to maintain a voltage across each battery in the parallel PTMD-battery groups approximately equal within a desired precision range, wherein the current transducer or shunt is capable of measuring equalization current and all other current through a battery for precise measurement of and calculation of current and charge/discharge capacity through the battery, wherein the main relay or switch is capable of isolating a battery that has a problem such as a short, and wherein the main relay or switch is capable of connecting and disconnecting the current transducer for a current calibration process.

29. A method for equalizing voltage between a plurality of batteries connected in parallel for formation and testing of the batteries, the method comprising the steps of:
providing a circuit assembly according to embodiment 28;
connecting a PTMD to each battery to form a PTMD-battery combination;
connecting the PTMD-battery combinations in parallel to form a parallel PTMD-battery group;
connecting an HVHC channel to the PTMD-battery group, wherein the HVHC channel is configured to provide a current and a voltage source for charging and discharging the batteries;
connecting a LVLC channel to the parallel PTMD-battery groups, wherein the LVLC channel is configured to provide current through the parallel PTMD-battery group; and
running current from HVHC channel and from the LVLC channel through the plurality of batteries simultaneously.

30. The method of embodiment 29, further comprising connecting in series two or more of the parallel PTMD-battery groups, thereby forming a parallel-serial battery group.

31. The method of embodiment 30, further comprising connecting a HVHC channel and a LVLC channel to the parallel-serial battery group for forming, testing and charging all of the batteries simultaneously under the same voltage and under a balanced-current distribution.

32. A method for forming and testing a plurality of batteries comprising the steps of:
providing a circuit assembly according to embodiment 28;
connecting a PTMD to each battery to form a PTMD-battery combination;
connecting the PTMD-battery combinations in parallel to form a parallel PTMD-battery group;
connecting an HVHC channel to the PTMD-battery group, wherein the HVHC channel is configured to provide a current and a voltage source for charging and discharging the batteries;
connecting an LVLC channel to the parallel PTMD-battery groups, wherein the LVLC channel is configured to provide current through the parallel PTMD-battery group;
connecting in series two or more of the parallel PTMD-battery groups, thereby forming a parallel-serial battery group; and
running current from HVHC channel and from the LVLC channel through the plurality of batteries simultaneously.

33. The method of embodiment 32, wherein the batteries are formed and tested using a constant-voltage-control process.

34. The method of embodiment 32, wherein the LVLCBTS is configured to realize constant current (CC), constant voltage (CV) and CC-CV functions without affecting smoothness during a CC-to-CV transition.

35. The method of embodiment 32, wherein the current required for the LVLC channels is approximately less than one-tenth (1/10th) of the current required for testing a battery or a parallel battery group.

36. The method of embodiment 34, further comprising measuring battery capacity and coulombic efficiency using both CC-CV charge and CC-CV discharge.

37. The method of embodiment 36, wherein current through batteries is approximately zero at the end of charge and discharge, and wherein the voltage drop across a circuit resistance, such as a relay and a shunt, is approximately zero at the end of both charge and discharge.

38. The method of embodiment 37, wherein the voltage is approximately the same for all of the batteries at the end of CC-CV, wherein the state of charge (SOC) is approximately the same at the end of CC-CV, and wherein the SOC is expressed as a percentage of the maximum capacity of a battery.

39. A serial-parallel testing module (SPTM) for forming and testing a plurality of batteries, the SPTM comprising:
a circuit board or an alternative means for receiving and connecting to the plurality of batteries and for receiving electrical components and for providing circuits among the electrical components and between the electrical components and the batteries;
a parallel test management device (PTMD) for each battery, wherein each PTMD connects to its respective battery serially to form a PTMD-battery combination, the PTMD comprising:
  a main relay or switch for connecting to a battery, wherein the main relay or switch is capable of isolating a battery that has a problem;
  a current transducer or shunt connected in series with the main relay, and wherein the current transducer or shunt is capable of measuring equalization current and all other current through a battery for precise measurement of and calculation of current and charge/discharge capacity through the battery; and
  an auxiliary relay connected in series with a current limiting resistor, wherein the auxiliary relay and the current limiting resistor are parallel to the main relay;
circuits for connecting PTMD-battery combinations in parallel to form a parallel PTMD-battery group and for connecting the parallel PTMD-battery group to a high voltage high current (HVHC) battery testing system (BTS) having a plurality of HVHC channels for testing multiple batteries simultaneously, wherein the HVHC channels are configured to provide programmed current, voltage or power, and wherein current is distributed to each battery in a balanced manner;
a low voltage low current (LVLC) BTS having a plurality of LVLC channels, wherein an LVLC channel is connected to each parallel PTMD-battery group but not to more than one parallel PTMD-battery group;
a first power supply port for receiving an electrical current from an outside source, wherein the HVHCBTS is connected to the first power supply port,
a second power supply port for receiving an electrical current from an outside source, wherein the LVLCBTS is connected to the second power supply port,
wherein a HVHC channel is connected to each battery or PTMD, wherein said HVHC channel provides a current and voltage source for charging and discharging the batteries, and
wherein the batteries are formed and tested by running current from the HVHCBTS and from the LVLCBTS through the plurality of batteries simultaneously.

40. The SPTM of embodiment 39, further comprising circuits for connecting the batteries or parallel PTMD-battery groups in series, wherein an LVLC channel is connected to each battery or parallel PTMD-battery group.

41. The SPTM of embodiment 39, wherein the circuit board or the alternative means for receiving and connecting to the plurality of batteries comprises a battery tray for holding the plurality of batteries, wherein the battery tray comprises:

a first printed circuit board (PCB) having opposing upper and lower sides and an edge;

a plurality of battery holders on the upper side of the PCB;

electronic devices or components operatively engaged with the plurality of battery holders through traces on or in the PCB for determining measurements of parameters of the plurality of batteries during formation and testing; and an edge connector on the edge of the PCB, wherein the edge connector is operatively engaged with the plurality of battery holders and with the electronic devices or components through traces on or in the PCB, wherein each battery holder comprises two or more upright spring fingers designed and sized to engage and hold a battery and a positive terminal designed and sized for contact with one end of a battery, and wherein the spring fingers function as a negative terminal for forming and testing a battery held in the battery holder.

42. The SPTM of embodiment 41, wherein the edge connector has first and second opposing sides, wherein each positive terminal is operatively connected to the first side, and wherein each negative terminal is operatively connected to the second side.

Having described the invention above, various modifications of the techniques, procedures, materials, and equipment will be apparent to those skilled in the art. It is intended that all such variations within the scope and spirit of the invention be included within the scope of the appended claims.

What is claimed is:

1. A circuit assembly for testing a plurality of batteries comprising:

a high voltage high current (HVHC) battery testing system (BTS) having a plurality of HVHC channels for testing multiple batteries simultaneously,
   wherein each HVHC channel provides programmed current, voltage or power, and
   wherein each HVHC channel is configured to test multiple batteries connected in a series configuration simultaneously; and a low voltage low current (LVLC) BTS having a plurality of LVLC channels,
   wherein an LVLC channel is connected to each battery or to each group of batteries in a parallel configuration but not to more than one battery or to more than one group of batteries in a parallel configuration,
   wherein each LVLC channel provides programmed current, voltage or power according to a preloaded schedule or to a command from a control unit,
   wherein the LVLCBTS is configured to provide measurement, storage and transfer of test data according to a programmed schedule or to an instruction from the control unit,
   wherein the HVHCBTS and the LVLCBTS are configured to pass current through each battery simultaneously, and
   wherein the current passed through each battery by the LVLCBTS is less than 10% of the current passed through each battery by the HVHCBTS.

2. The circuit assembly of claim 1, wherein each LVLC channel is configured to operate as an independent battery testing channel for a first battery or for a first group of batteries in a parallel configuration while no current from an HVHC channel flows through the first battery or through the first group of batteries in a parallel configuration.

3. The circuit assembly of claim 2, wherein a plurality of the LVLC channels are configured to share a common source of current.

4. The circuit assembly of claim 1, wherein an amount of current flowing through a second battery or through a second group of batteries in a parallel configuration while current from an HVHC channel and from a LVLC channel flows through the second battery or through the second group of batteries in a parallel configuration is the sum of the current from said HVHC channel and from said LVLC channel.

5. The circuit assembly of claim 1, wherein the current passed through each battery by the LVLCBTS is less than 6% of the current passed through each battery by the HVHCBTS.

6. The circuit assembly of claim 1, wherein the current passed through each battery by the LVLCBTS is approximately 0% to 5% of the current passed through each battery by the HVHCBTS.

7. The circuit assembly of claim 1, further comprising equipment and circuits for discharging the plurality of batteries, thereby providing a discharge current, and for passing the discharge current to an external electrical grid system.

8. The circuit assembly of claim 1, wherein each of the plurality of LVLC channels is configured with multiple current ranges.

9. The circuit assembly of claim 8, wherein each of the plurality of LVLC channels is configured to perform voltage equalization for its respective battery or group of batteries in a parallel configuration by using a current corresponding to one of the multiple current ranges.

10. The circuit assembly of claim 8, wherein each of the plurality of LVLC channels is configured to perform tests for its respective battery or group of batteries in a parallel configuration by using a current corresponding to one of the multiple current ranges, wherein the tests are related to measuring one or more parameters comprising internal resistance, impedance, conductance, capacity, voltage, self-discharge, ability to accept a charge/discharge and state of health.

11. The circuit assembly of claim 1, wherein the batteries in the plurality of batteries are of the same type and have the same capacity within about plus or minus 6%.

12. The circuit assembly of claim 1, wherein the plurality of HVHC channels are configured to provide sufficiently high levels of voltage and current to perform tests on the batteries to provide measurements of one or more of parameters, and wherein the parameters include internal resistance, impedance, conductance, capacity, voltage, self-discharge, ability to accept a charge/discharge and state of health.

13. The circuit assembly of claim 1, wherein the plurality of HVHC channels are configured to cut off or shut off a high-current loop to protect one or more batteries.

14. The circuit assembly of claim 1, wherein the plurality of LVLC channels are configured to have approximately the same specifications.

15. The circuit assembly of claim 1, wherein the LVLC channels are configured to provide lower current, lower noise and higher resolution than the HVHC channels for testing the batteries.

16. The circuit assembly of claim 1, wherein the LVLC channels are configured to provide an equalization current to their respective batteries to keep said batteries at about the same voltage while the HVHC channels provide charge and discharge current and voltage to said batteries and while the HVHC channels are turned off and not providing current through said batteries.

17. The circuit assembly of claim 1, wherein the LVLC channels are configured to provide independent low-voltage and low-current battery testing on each battery at a higher level of precision than provided by the HVHC channels while the HVHC channels are shut down or turned off.

18. The circuit assembly of claim 1, wherein the LVLC channels are configured to provide independent low-voltage and low-current battery testing on each battery at a higher level of precision than provided by the HVHC channels while the HVHC channels are providing a background current through the batteries.

19. The circuit assembly of claim 1, wherein the LVLC channels are configured to measure and compare differential current and capacity of each battery to obtain a higher level of precision than provided by the HVHC channels for measuring a battery's current, capacity and coulomb efficiency.

20. The circuit assembly of claim 1, wherein the HVHC channels and the LVLC channels are configured to provide independent, full-scale battery testing systems that are configured to download and store a test schedule and a system configuration and to execute the test schedule.

21. The circuit assembly of claim 1, wherein the HVHC channels and the LVLC channels are configured to conduct constant current (CC) charge and discharge for the batteries.

22. The circuit assembly of claim 1, wherein the HVHC channels and the LVLC channels are configured to conduct constant current to constant voltage (cccv) charge and discharge of the batteries.

23. The circuit assembly of claim 1, wherein the HVHC channels and the LVLC channels are configured to provide protection against overcharge, over discharge and over temperature of the batteries.

24. The circuit assembly of claim 1, wherein the HVHC channels and the LVLC channels are configured to measure, store and transfer test data.

25. The circuit assembly of claim 1, wherein the HVHC channels and the LVLC channels are configured to receive and to respond to instructions from the control unit.

26. The circuit assembly of claim 1, wherein the plurality of LVLC channels are configured to provide low levels of voltage and current to perform tests on the batteries to provide measurements of one or more of parameters, and wherein the parameters include internal resistance, impedance, conductance, capacity, voltage, self-discharge, state of health and ability to accept a charge/discharge.

* * * * *